United States Patent
Yamada

[19]

[11] Patent Number: 5,887,012
[45] Date of Patent: Mar. 23, 1999

[54] SEMICONDUCTOR LASER ARRAY

[75] Inventor: Hirohito Yamada, Tokyo, Japan

[73] Assignee: NEC Corporation, Tokyo, Japan

[21] Appl. No.: 762,319

[22] Filed: Dec. 9, 1996

[30] Foreign Application Priority Data

Dec. 14, 1995 [JP] Japan .................................. 7-347016

[51] Int. Cl.[6] ...................................................... H01S 3/19
[52] U.S. Cl. .............................................. 372/50; 372/46
[58] Field of Search .................................. 372/50, 46, 36

[56] References Cited

U.S. PATENT DOCUMENTS

| | | | |
|---|---|---|---|
| 4,977,570 | 12/1990 | Hasegawa | 372/50 |
| 5,179,567 | 1/1993 | Uomi et al. | 372/46 |
| 5,513,200 | 4/1996 | Paoli | 372/50 |

OTHER PUBLICATIONS

Oishi et al, "The 19th European Conference on Optical Communication," 1993, Switzerland, pp. 21–24 (No month).

*Primary Examiner*—James W. Davie
*Attorney, Agent, or Firm*—Laff, Whitesel, Conte & Saret, Ltd.

[57] ABSTRACT

A semiconductor laser array according to the invention is so constructed that plural LDs are driven by the same modulating signal, and series connection of the plural LDs becomes possible. Accordingly, efficiency of modulation of the aforementioned semiconductor laser array is largely improved. After a n-InP clad layer 6, an active layer 7 and a p-InP layer 8 are successively grown on a semi-insulating substrate 5, the n-InP clad layer 6 is etched and a stripe shaped mesa is formed. Then, a p-InP current blocking layer 9 and a n-InP current blocking layer 10 are grown on the etched portion. After fabricating a p+-InP cap layer 11 thereon, the surface of the n-InP clad layer 6 is exposed by selective etching. Moreover, a channel 12 for isolating the adjacent LDs, reaching the semi-insulating layer 5, is formed by penetrating the n-InP clad layer 6. Each of the LDs is provided with a p-side electrode 13 and a n-side electrode 14 thereon, and a p-side electrode 13 of any LD is connected to the n-side electrode of an adjacent LD by a bonding wire 3.

5 Claims, 4 Drawing Sheets

SEMICONDUCTOR LASER ARRAY

FIELD OF THE INVENTION

The invention relates to a structure of a semiconductor laser array, and especially to the structure of the semiconductor laser array for a sub-carrier multiplexing optical signal transmission system used in an optical CATV with high capacity.

BACKGROUND OF THE INVENTION

Recently, the capacity of the optical CATV transmission system is remarkably increasing, and the number of television channels becomes as large as 100 to 150. Then, required characteristics to a semiconductor laser diode (LD, hereinafter), serving as a light source in the optical CATV system, gradually become higher and severer. For example, in an analog modulation circuit for an optical CATV of 150 chs, required characteristics of the LD are that, composite second order (CSO) distortion $\leq -60$ dB, composite triple beat (CTB) $\leq -65$ dB and output power (Po) $\geq 20$ mW, and production yield of the LD satisfying the aforementioned requirements is very low at present.

In view point of the present situation, the present inventors have proposed a multi-LD array in which plural LDs are simultaneously modulated by the same electrical signal comprising a great many channels of television signals, and plural optical signals thus obtained are multiplexed by a multiplexer, and specification on distortions of individual LDs are effectively relaxed, because the light-power of each LD is decreased. According to the multi-LD array, the production yield of the LDs can be improved, because specifications on distortions of each of the LDs are relaxed.

However, several disadvantages have been pointed out on the conventional multi-LD array.

Since plural input electrodes for receiving an electrical modulating signal are provided on the respective LDs, the LDs are respectively connected to the same output terminal of a modulating signal generator by plural bonding wires. Then, the wiring inductances of the bonding wires and the parasitic capacitances of bonding pads arise in the input portion of the plural LDs, and the band width of a modulated optical signal is largely decreased.

Moreover, since the LDs in the conventional multi-LD array are connected in parallel, the input impedance of the multi-LD array is very low as compared with the output impedance of the modulating signal generator. Then, the greater part of a modulating signal power is consumed in a resistor inserted therebetween for impedance matching.

SUMMARY OF THE INVENTION

Accordingly, it is an object of the invention to provide a semiconductor laser array in which a wide band characteristic of a modulated optical signal is obtained by making the lengths of bonding wires be as short as possible, and by decreasing wiring inductances of the bonding wires and parasitic capacitance of a bonding pad.

It is a further object of the invention to provide a semiconductor laser array, an input impedance of which can be well matched with the output impedance of the modulating signal generator, being 50Ω in most cases, and in which efficiency of modulation of optical power is remarkably improved.

According to the first feature of the invention, a semiconductor laser array, comprises:
a common electrode of plural LDs formed on a semiconductor substrate,
stripe shaped electrodes formed over the plural LDs, each of which communicates with one of the plural LDs, and
a bonding pad electrically connected to each of the plural stripe shaped electrodes via bridge elements.

According to the second feature of the invention, a semiconductor laser array, comprises:
plural LDs, each of which is composed of a clad layer of a first conductivity type, a stripe shaped active layer and a clad layer of a second conductivity type, each being successively grown on a semi-insulating substrate, and
plural channels for electrically isolating the LDs, each of which starts from a surface of a semiconductor layer formed between the adjacent LDs and reaches the semi-insulating substrate.

BRIEF DESCRIPTION OF THE DRAWINGS

The invention will be explained in more detail in conjunction with the appended drawings, wherein.

DESCRIPTION OF THE PREFERRED EMBODIMENTS

Before explaining the preferred embodiments according to the invention, the aforementioned conventional multi-LD array will be explained.

Figure 1:
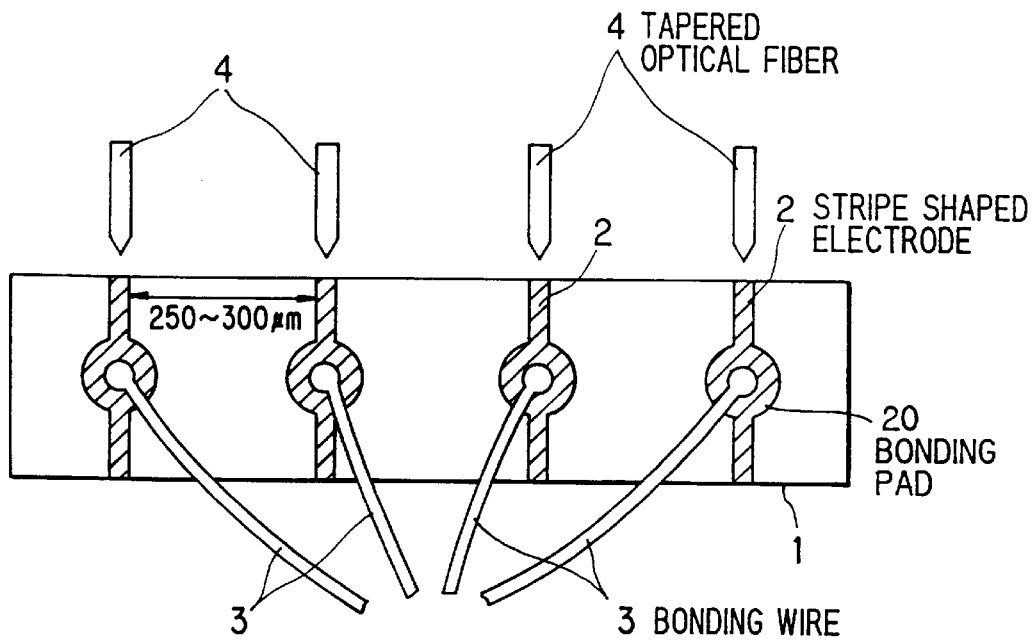
FIG. 1 shows a planar view of a conventional semiconductor laser array.

FIG. 1 shows a planar view of a conventional multi-LD array. On a top surface of a semiconductor chip 1, stripe shaped electrodes 2, which respectively correspond to stripe shaped active layers contained in the semiconductor chip 1, are provided, and a common electrode (not shown) is formed on a bottom surface of the semiconductor chip 1. In the multi-LD array shown in FIG. 1, each of LDs is supplied with the same electrical modulating signal voltage via a bonding wire 3 bonded to a bonding pad 20, and each of light powers generated therein is propagated via a tapered optical fibers 4.

However, in the conventional multi-LD array, since the input electrodes of the LDs are isolated from each other, the input electrodes of the respective LDs must be connected to a modulating signal generator by bonding wires. Moreover, since the interval of the adjacent LDs is 250 to 300 μm in many cases, the bonding wires become long and have large wiring inductances, and then the band width of a modulated optical signal is limited.

Moreover, since a bonding pad must be provided on each of the stripe shaped electrodes, total area of stripe shaped electrodes increases. Still more, since the total length of the bonding wires increases, a total parasitic capacitance subsequently becomes large, and this situation is another cause for limiting the band width of a modulated optical signal.

Figure 2A:
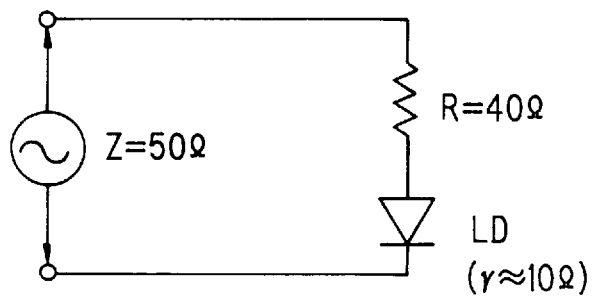
FIG. 2A is a circuit diagram showing a way of connecting a semiconductor laser array to a modulating signal generator via a resistor for impedance matching, in case that the semiconductor laser array is composed a single elemental LD.

Moreover, since the conventional multi-LD array is fabricated on a n- or p-type semiconductor substrate, any one of the surfaces of the substrate must inevitably serves as a common electrode, and then only parallel electrical connection of the LDs is permissible. Since the impedance of the LD is about 10Ω usually, when a single LD is connected to the modulating signal generator with an output impedance of 50Ω, a series resistor R of 40Ω must be inserted between them for impedance matching as shown in FIG. 2A. Then, 80% of the modulating signal power is consumed in the inserted resistor R, and only 20% of the modulating signal power is supplied to the LD.

Figure 2B:
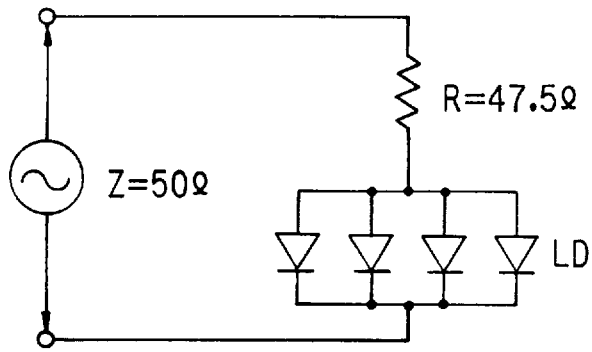
FIG. 2B is a circuit diagram showing a way of connecting a semiconductor laser array to a modulating signal generator via a resistor for impedance matching, in case that the semiconductor laser array is composed of four LDs connected in parallel.

In the conventional multi-LD array composed of four LDs connected in parallel, the input impedance is about 2.5Ω, and when this LD array is connected to the modulating signal generator with output impedance of 50Ω, the series resistance of 47.5Ω must be inserted between them for impedance matching as shown in FIG. 2B. In this case, 95% of the modulating signal power is consumed in the series resistor R, and the modulating power supplied to the multi-LD array and efficiency of modulation is extremely low. Then, the large modulating RF power is necessary in the conventional multi-LD array.

The structure of a semiconductor laser array according to the first preferred embodiment of the invention is that, a common electrode is formed on a bottom surface of a semiconductor substrate, and plural stripe shaped electrodes are formed on a top surface of the semiconductor substrate, where the stripe shaped electrodes are connected in common by a bonding pad, being electrically connected to the respective stripe shaped electrodes by bridge elements.

It is preferable that the pitch of the stripe shaped active layers contained in the LDs is longer than 10 μm and shorter than 50 μm.

The semiconductor laser array according to the second preferred embodiment of the invention is composed of several numbers of the LDs fabricated on a semi-insulating substrate, each of which comprises a clad layer of the first conductivity type, a stripe shaped active layer and a clad layer of the second conductivity type, being successively grown on the semi-insulating substrate. Moreover, the individual LDs are electrically isolated from the adjacent LDs by channels which start from the surface of the semiconductor layer formed between the adjacent LDs and reach the semi-insulating substrate.

In the first preferred embodiment invention, since all the electrodes formed on the top surface of the semiconductor chip are electrically connected to a common bonding pad via bridge elements, electrical powers can be supplied to the respective LDs via a single bonding wire. Then, since the length of the bonding wire is shortened, its wiring inductance can be decreased. Moreover, since a single bonding pad is used in common by all the electrodes, the areas of the electrodes can be decreased. Since the length of the bonding wire is shortened, its parasitic capacitance is decreased, and the wide band characteristic of the modulated optical signal can be realized.

As mentioned in the above, since the wiring inductance and parasitic capacitance are decreased in the input portion of the semiconductor laser array, the band width of the modulated optical signal is as wide as 1 GHz, and the optical CATV of 150 chs can be satisfactorily transmitted. However, if the interval between the adjacent LDs is less than about 5 μm, the electric fields of the lights in the LDs are coupled to each other, and the LDs show quite different operation from the former ones. A phase locked laser is well known as an example similar to the above mentioned semiconductor laser array. Accordingly, it is desirable that the interval between the adjacent elemental lasers is longer than 10 μm. Moreover, it is desirable that the interval of the adjacent LDs is less than 50 μm, in order to obtain a wide band characteristic by decreasing the area of the electrodes.

Figure 2C:
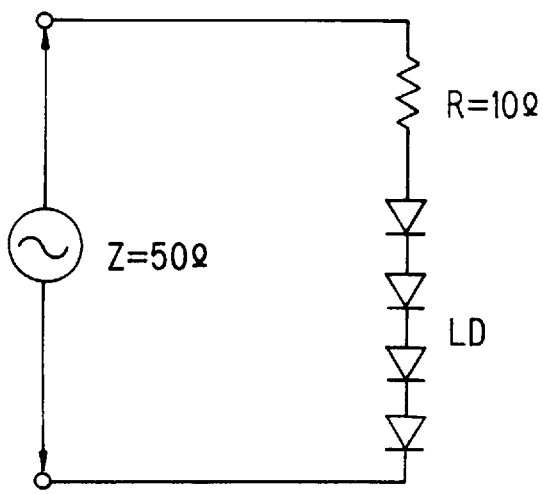
FIG. 2C is a circuit diagram showing a way of connecting a semiconductor laser array to a modulating signal generator via a resistor for impedance matching, in case that the semiconductor laser array is composed of four LDs connected in series.

In the semiconductor laser array according to the second preferred embodiment of the invention, the semiconductor laser array is fabricated on the semi-insulating substrate, and provided with the channels, each of which starts from a surface of semiconductor layer formed between the adjacent LDs and reaches the semi-insulating substrate. Then, the respective LDs are electrically isolated from each other, and it becomes possible to connect the plural LDs in series. When the semiconductor laser array is composed of a series connection of the four LDs, its input impedance becomes about 40Ω. Then, if the series resistor of about 10Ω is inserted between a modulating signal generator with the output impedance of 50Ω and the semiconductor laser array as shown in FIG. 2C, the impedances of both the circuits are matched with each other. In such a case, 80% of a supplied RF power is transmitted to the semiconductor laser array, and the efficiency of modulation is remarkably improved as compared with that of the conventional multi-LD array, in which plural LDs are connected in parallel. Namely, modulation of the optical signal can be carried out by the small RF power.

If the semiconductor laser array is composed of the series connection of the five LDs, its input impedance becomes about 50Ω, and the impedances of both the aforementioned circuits can be matched without the series impedance, and this situation seems to be desirable from the view point of impedance matching. However, the series resistance is necessary to some extent from the view point of stabilizing a current supplied to the semiconductor laser array, and it is not desirable to eliminate the series resistance.

Next, the preferred embodiments of the invention will be explained referring to the appended drawings.

Figure 3:
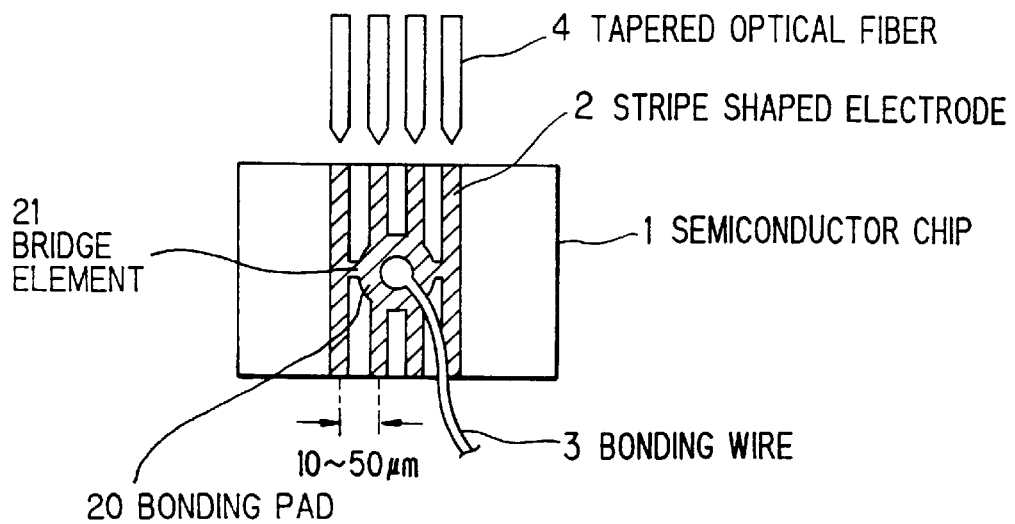
FIG. 3 is a planar view showing the first preferred embodiment of the invention.

FIG. 3 is a planar view of a semiconductor laser array, which comprises four LDs and a common bonding pad 20 for receiving the modulating signal voltage, shown as the first preferred embodiment of the invention. As shown in FIG. 3, four stripe shaped electrodes 2, which respectively correspond to four stripe shaped active layers (not shown) fabricated in a chip, are provided on a top surface of the semiconductor chip 1, and connected in common to the bonding pad 20 via bridge elements 21. Moreover, a common electrode (not shown) is formed on a bottom surface of the substrate. Each of the stripe shaped electrodes 2 is supplied with the modulating signal power through a single bonding wire 3. Each of light powers emitted from LDs is carried out by a tapered optical fiber 4. In this embodiment, the interval between the adjacent LDs, in other word, the pitch of the LDs is as small as 10 to 50 μm. In the conventional multi-LD array, the aforementioned interval is 250 to 300 μm.

Figure 4:
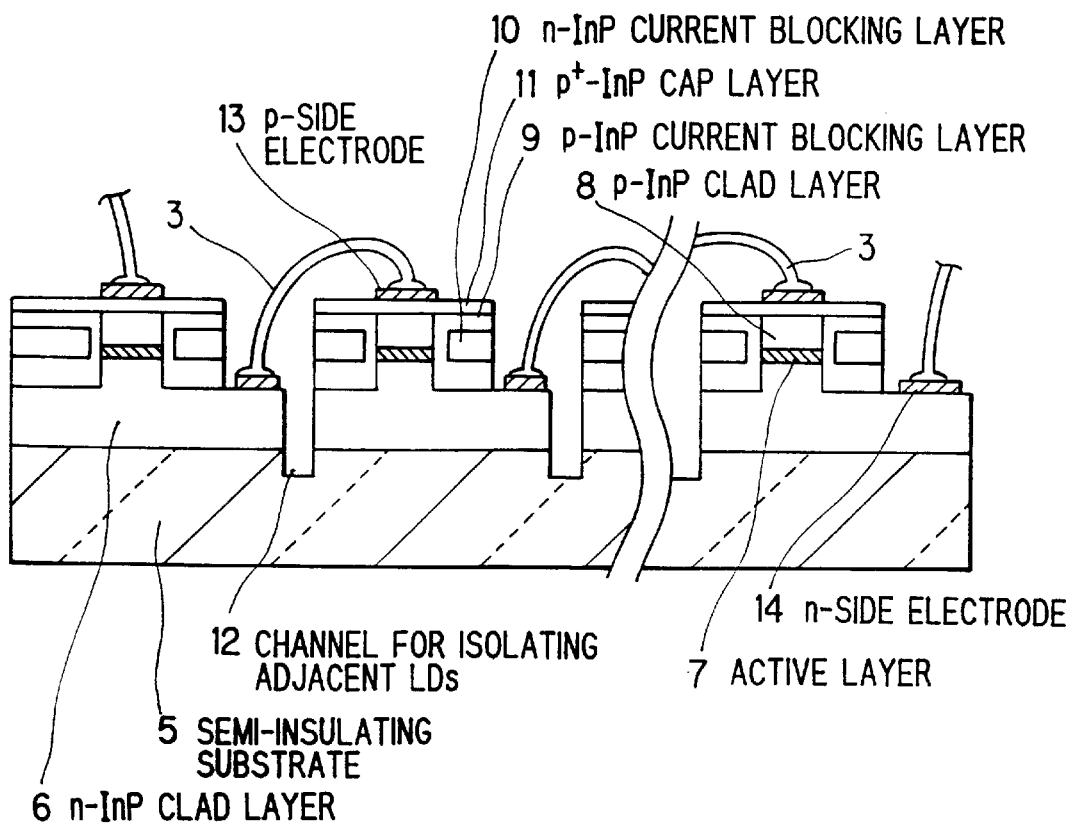
FIG. 4 is a cross-sectional view showing the second preferred embodiment of the invention.

FIG. 4 shows the cross-sectional view of a semiconductor laser array composed of plural LDs connected in series, being shown as the second preferred embodiment of the invention. The process of fabricating the semiconductor laser array is as follows. First, a n-INP clad layer 6 with a thickness of about 5 μm is grown on a semi-insulating substrate 5. Next, an active layer 7 composed of InGaAsP and a p-InP clad layer 8 are successively grown thereon, and a double-hetero structure can be formed. If a DFB-laser is desired, a corrugation grating is formed upper or lower side of the active layer 7 by suitable process. Moreover, a MQW structure may be applied to the active layer 7.

Next, a striped shaped mesa structure is obtained by etching the processed substrate, and p-InP, n-InP and p-InP layers are successively grown on the etched portion, and then a p-InP current blocking layer 9 and a n-InP current blocking layer 10 can be obtained. After forming a p+-InP cap layer 11 on the p-InP current block layer 9, a surface of the n-InP clad layer 6 is exposed, by etching the cap layer and the current blocking between the LDs in order to form an electrode thereon. Thereafter, a channel 12 for isolating the adjacent LDs which penetrates a n-InP clad layer 6 and reaches the semi-insulating layer 5, is formed. Then, a p-side electrode 13 is formed on the p+-InP cap layer 11, and a n-side electrode 14 is formed on the n-InP clad layer 6, and the fabricating process of the semiconductor laser array according to the invention is completed.

When the laser array is implemented, the electrode of one end of the semiconductor laser array is connected to a grounding terminal by a bonding wire 3, and the n-side electrode 14 of the LD in the array is connected to the p-side electrode 13 of the adjacent LD by the bonding wire 3.

In the aforementioned embodiment, InGaAs material for long wavelength emission is used as the one of the active layer. Moreover, AlGaAs material for short wavelength emission, or AlGaInP material for visual wavelength emission can be used for the same object.

Figure 5:
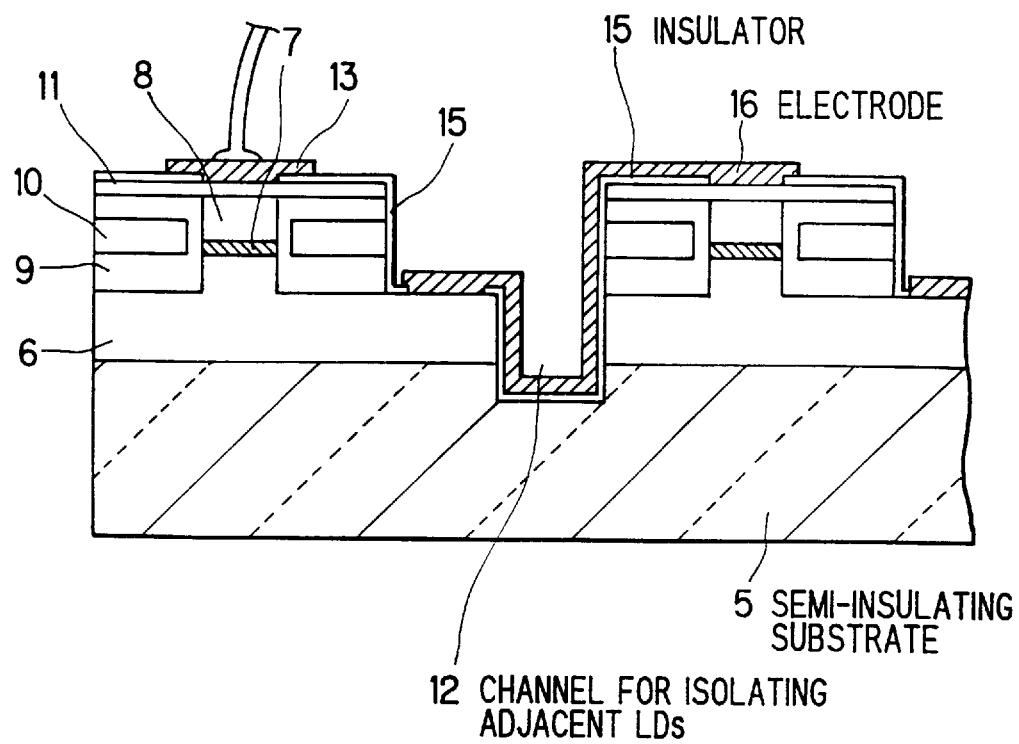
FIG. 5 is a cross-sectional view showing the third preferred embodiment of the invention.

FIG. 5 is a cross-sectional view showing the semiconductor laser array composed of series connection of the LDs as the third preferred embodiment of the invention. The process of fabricating the semiconductor laser array according to this embodiment is the same as that of the second preferred embodiment, till the channel 12 for isolating the LD from the adjacent LDs is made up. Thereafter, an insulating film 15 is formed by depositing $SiO_2$ or $Si_3N_4$, and after opening a window for making ohmic contact thereon, a p-side electrode 13 and a n-side electrode are respectively formed at the ends of the laser array, and a connecting electrode 16, which connects a n-InP clad layer 6 to a p+-InP cap layer 11 of the adjacent LD, is formed between the LDs.

As mentioned in the above, in the semiconductor laser array according to the first preferred embodiment of the invention, since the parasitic capacitance can be decreased by reducing the number of the bonding pads, and the inductance of the bonding wire can be decreased by shortening the length thereof, the wide band characteristic of modulation of the optical signal can be realized. In the semiconductor laser array according to the second preferred embodiment of the invention, since the modulating signal generator with the output impedance of 50Ω can be easily matched with the input impedance of the semiconductor laser array and efficiency of modulation can be largely improved, and the burden on the modulating signal generator can be reduced. As mentioned in the above, the semiconductor laser array according to the invention is suited for the improved multi-LD array, which will satisfactorily cope with the multi-channel optical CATV, expected to be realized in near future.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor laser array, comprising:
   a common electrode of plural laser diodes (LDs, hereinafter) formed on a semiconductor substrate,
   stripe shaped electrodes formed over said plural LDs, each of which applies a lasing signal to each one of said plural LDs, and
   a single bonding pad electrically connected to and in common with each of said plural striped shaped electrodes via bridge elements.

2. A semiconductor laser array, according to claim 1, wherein:
   a pitch of active layers is longer than 10 μm and shorter than 50 μm.

3. A semiconductor laser array, comprising:
   a plurality of laser diodes arrayed on a first plane of a common substrate;
   individual electrodes provided on said plurality of laser diodes;
   bridge elements for electrically connecting said individual electrodes; and
   a common electrode provided on a second plane of said common substrate;
   wherein said individual electrodes and said bridge elements are connected to a power supply of a first potential by a common bonding wire, and said common electrode is connected to a power supply of a second potential.

4. A semiconductor laser array, according to claim 3, wherein:
   each of said individual electrodes is shaped to be stripe, and has a distance ranging 10 to 50 μm between two adjacent ones.

5. A semiconductor laser array, according to claim 3, wherein:
   said bridge elements are connected to a bonding pad of a circular shape to be connected to said common bonding wire.

* * * * *